US010844325B2

United States Patent
Daeschlein et al.

(10) Patent No.: US 10,844,325 B2
(45) Date of Patent: *Nov. 24, 2020

(54) COMPOSITION FOR POST CHEMICAL-MECHANICAL-POLISHING CLEANING

(71) Applicant: BASF SE, Ludwigshafen am Rhein (DE)

(72) Inventors: Christian Daeschlein, Bochum (DE); Max Siebert, Ludwigshafen (DE); Michael Lauter, Mannheim (DE); Peter Przybylski, Ludwigshafen (DE); Julian Proelss, Worms (DE); Andreas Klipp, Lambsheim (DE); Haci Osman Guevenc, Heidelberg (DE); Leonardus Leunissen, Ludwigshafen (DE); Roelf-Peter Baumann, Mannheim (DE); Te Yu Wei, Taoyuan (TW)

(73) Assignee: BASF SE, Ludwigshafen am Rhein (DE)

( * ) Notice: Subject to any disclaimer, the term of this patent is extended or adjusted under 35 U.S.C. 154(b) by 15 days.

This patent is subject to a terminal disclaimer.

(21) Appl. No.: 16/064,918

(22) PCT Filed: Dec. 20, 2016

(86) PCT No.: PCT/EP2016/081847
§ 371 (c)(1),
(2) Date: Jun. 21, 2018

(87) PCT Pub. No.: WO2017/108743
PCT Pub. Date: Jun. 29, 2017

(65) Prior Publication Data
US 2018/0371371 A1 Dec. 27, 2018

(30) Foreign Application Priority Data
Dec. 22, 2015 (EP) .................... 15201910

(51) Int. Cl.
*C11D 3/37* (2006.01)
*H01L 21/02* (2006.01)
*C11D 11/00* (2006.01)
*C11D 3/00* (2006.01)

(52) U.S. Cl.
CPC .......... *C11D 3/3707* (2013.01); *C11D 3/0026* (2013.01); *C11D 3/378* (2013.01); *C11D 3/3719* (2013.01); *C11D 3/3765* (2013.01); *C11D 3/3784* (2013.01); *C11D 11/0035* (2013.01); *C11D 11/0047* (2013.01); *H01L 21/02074* (2013.01)

(58) Field of Classification Search
CPC ... C11D 3/3707; C11D 3/3746; C11D 3/3765; C11D 3/378; C11D 3/3784; H01L 21/02
See application file for complete search history.

(56) References Cited

U.S. PATENT DOCUMENTS

| 3,907,985 A | 9/1975 | Rankin |
| 5,595,681 A | 1/1997 | Panandiker et al. |
| 7,851,426 B2 | 12/2010 | Nishiwaki et al. |
| 2009/0056744 A1 | 3/2009 | Carswell |
| 2011/0094044 A1 | 4/2011 | Shamayeli et al. |
| 2013/0244433 A1* | 9/2013 | Reiss ................ H01L 21/30625 438/693 |

FOREIGN PATENT DOCUMENTS

| JP | 2009-69505 A | 4/2009 |
| WO | WO 01/14496 A1 | 3/2001 |
| WO | WO 2008/023215 A1 | 2/2008 |
| WO | WO 2013/123317 A1 | 8/2013 |

OTHER PUBLICATIONS

International Search Report dated Apr. 20, 2017, in PCT/EP2016/081847, filed Dec. 20, 2016.
International Preliminary Report on Patentability dated Mar. 29, 2018, in PCT/EP2016/081847, filed Dec. 20, 2016.
Written Opinion of the International Searching Authority dated May 2, 2017 in PCT/EP2016/081847, filed Dec. 20, 2018, 6 pages.

* cited by examiner

*Primary Examiner* — Brian P Mruk
(74) *Attorney, Agent, or Firm* — Oblon, McClelland, Maier & Neustadt, L.L.P.

(57) ABSTRACT

A post chemical-mechanical-polishing (post-CMP) cleaning composition including:
(A) polyethylene glycol (PEG) with a mass average molar mass (Mw) in the range of from 400 to 8,000 g/mol,
(B) an anionic polymer selected from poly(acrylic acid) (PAA), acrylic acid-maleic acid copolymers, polyaspartic acid (PASA), polyglutamic acid (PGA), polyvinylphosphonic acid, polyvinylsulfonic acid, poly(styrenesulfonic acid), polycarboxylate ethers (PCE), PEG-phosphorous acids, and copolymers of the polymers thereof, and
(C) water,
where the pH of the composition is from 7.0 to 10.5.

13 Claims, No Drawings

COMPOSITION FOR POST CHEMICAL-MECHANICAL-POLISHING CLEANING

The present invention relates to a post chemical-mechanical-polishing (abbreviated as post-CMP) cleaning composition comprising a specific polyethylene glycol (PEG), to a use of a composition according to the present invention as cobalt post chemical-mechanical-polishing cleaner and/or for cleaning a substrate comprising cobalt, and to a process for the manufacture of a semiconductor device from a semiconductor substrate comprising the step of removing residues and contaminants from the surface of the semiconductor substrate by contacting it at least once with a cleaning composition according to the present invention.

The fabrication of electrical materials and devices, in particular, semiconductor integrated circuits (ICs); liquid crystal panels; organic electroluminescent panels; printed circuit boards; micro machines; DNA chips; micro plants and magnetic heads; preferably ICs with LSI (large-scale integration) or VLSI (very-large-scale integration); as well as optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks; requires high precision methods which involve inter alia surface preparation, pre-plaiting cleaning, post-etch cleaning and/or post chemical-mechanical-polishing cleaning steps using highpurity cleaning compositions.

Particular care has to be taken in the fabrication of ICs with LSI or VLSI. The semiconductor wafers used for this purpose include a semiconductor substrate such as silicon, into which regions are patterned for the deposition of different materials having electrically insulative, conductive or semiconductive properties.

In order to obtain the correct patterning, excess material used in manufacturing the various layers on the substrates must be removed. Further, to fabricate functional and reliable ICs, it is important to have flat or planar semiconductor wafer surfaces. Thus, it is necessary to remove and/or polish certain surfaces of a semiconductor wafers during the fabrication of the ICs before carrying out the next process steps.

In the semiconductor industry, chemical-mechanical-polishing (abbreviated as CMP) is a well-known technology applied in the treatment of semiconductor wafers for fabricating electrical materials and devices.

During the fabrication of materials and devices used in the semiconductor industry, CMP is employed to planarize metal and/or oxide surfaces. CMP utilizes the interplay of chemical and mechanical action to achieve the planarity of the surfaces to be polished. The CMP process itself typically involves holding and rotating a thin, flat (e.g patterned) substrate of the semiconductor device against a wetted polishing pad under controlled pressure and temperature in the presence of CMP slurries. The CMP slurries contain abrasive materials and various chemical additives as appropriate to the specific CMP process and requirements. At the end of the CMP process, contaminants and residues comprising particles from the CMP slurries, added chemicals, and reaction by-products remain on the polished substrate surface. These contaminants and residues that are left on the substrates after CMP processing can also include corrosion inhibitor compounds such as benzotriazole (BTA), which can—if, for example, the metal ion concentration exceeds the maximum solubility of the metal-inhibitor complexes during CMP—precipitate from solution and coagulate such that a coagulated corrosion inhibitor surface residue is formed.

Recent improvements in wafer processing and fabrication have led to the use of new materials, —especially metals and metal alloys—for the microelectronic device fabrication. For example, conventional barrier layer materials have been replaced with cobalt (Co) and cobalt alloys in integrated circuits to reduce the thickness of the layer and the size of the integrated circuits. Another approach is to use Cobalt as new plug material in integrated circuits. As these new cobalt containing or cobalt alloy layers and plugs are introduced, there is a demand in industry for post-CMP removal compositions which are capable of removing the post-CMP residue and contaminants (including said precipitated corrosion inhibitors) without deleteriously affecting said new cobalt layer materials.

It is important that all residues and contaminants are removed prior to any further steps in the microelectronic device fabrication process to avoid degradation of the device reliability and introduction of defects into the microelectronic devices during their manufacturing.

In the state of the art, (post-CMP) cleaning compositions are known and described, for instance, in the following references:

U.S. Pat. No. 7,851,426 B1 discloses a cleaning liquid used in a cleaning step of a semiconductor device post-CMP comprising a polycarboxylic acid, an anionic surfactant having an aromatic ring structure in a molecule, a polymer compound having an acidic group on a side chain, and a polyethylene glycol, wherein the cleaning liquid has a pH of 5 or less.

US 2009/0056744 A1 discloses a method of cleaning a semiconductor wafer of organic deposit resulting from an abrasive process, comprising exposing a hydrophobic surface of a semiconductor wafer to a cleaning solution which is substantially free of ammonia and comprises an oxidizing agent and at least one polycarboxylate surfactant.

WO 2013/123317 A1 discloses a composition for cleaning residue and contaminants from a surface, wherein said composition comprises at least one oxidizing agent, at least one complexing agent, at least one basic compound, at least one buffering agent, and water.

JP2009-069505 A discloses a cleaning solution for the cleaning of aluminium containing substrates comprising a combination of ingredients including a basic substance such as sodium hydroxide, an alkaline earth metal salt such as calcium chloride, polyacrylic acids, and water.

One of the objects of the present invention was to provide post-CMP compositions that are capable of substantially and efficiently removing post-CMP residues and contaminants especially from a substrate that contains or consists of cobalt or cobalt alloys (e.g. cobalt as part of a layer or as plug) without deleteriously affecting the electrical materials and devices, especially without deleteriously affecting semiconductor integrated circuits.

Furthermore, one of the objects of the present invention was to provide a post-CMP composition which is environmentally benign and easy to use.

According to an aspect of the present invention, a post chemical-mechanical-polishing (post-CMP) cleaning composition is provided comprising or consisting of:
(A) polyethylene glycol (PEG) with a mass average molar mass (Mw) in the range of from 400 to 8,000 g/mol, preferably in the range of from 600 to 4,000 g/mol, more preferably in the range of from 600 to 2,000 g/mol, more preferably in the range of from 600 to 1500 g/mol,
(B) an anionic polymer selected from the group consisting of poly(acrylic acid) (PAA), acrylic acid-maleic acid copolymers, polyaspartic acid (PASA), polyvinylphosphonic acid, polyvinylsulfonic acid, poly(styrenesulfonic acid), polycarboxylate ethers (PCE), PEG-phosphorous acids, and copolymers of said polymers, preferably wherein said anionic polymer (B) is a poly(acrylic acid) (PAA) or an acrylic acid-maleic acid copolymer, and
(C) water,
wherein the pH of the composition is in the range of from 7.0 to 10.5.

According to another aspect of the present invention, a post chemical-mechanical-polishing (post-CMP) cleaning composition comprising or consisting of:
(A) polyethylene glycol (PEG) with a mass average molar mass (Mw) in the range of from 400 to 8,000 g/mol,
(B) an anionic polymer selected from the group consisting of poly(acrylic acid) (PAA), acrylic acid-maleic acid copolymers, polyglutamic acid (PGA), polyvinylphosphonic acid, polyvinylsulfonic acid, polycarboxylate ethers (PCE), PEG-phosphorous acids, and copolymers of said polymers, and
(C) water,
wherein the pH of the composition is in the range of from 7.0 to 10.5.

According to another aspect of the present invention, use of a cleaning composition comprising or consisting of:
(A) polyethylene glycol (PEG) with a mass average molar mass (Mw) in the range of from 400 to 8,000 g/mol,
(B) an anionic polymer selected from the group consisting of poly(acrylic acid) (PAA), acrylic acid-maleic acid copolymers, polyaspartic acid (PASA), poly-glutamic acid (PGA), polyvinylphosphonic acid, polyvinylsulfonic acid, poly(styrenesulfonic acid), polycarboxylate ethers (PCE), PEG-phosphorous acids, and copolymers of said polymers, and
(C) water,
wherein the pH of the composition is in the range of from 7.0 to 10.5, as a post chemical-mechanical-polishing (post-CMP) cleaning composition.

In view of the prior art discussed above, it was surprising and could not be expected by the skilled person in the art that the objects underlying the present invention could be solved by the cleaning composition according to the invention.

It was surprisingly found that the cleaning compositions according to the invention are capable of substantially and efficiently removing post-CMP residues and contaminants especially from a substrate that contains or consists of cobalt or cobalt alloys without deleteriously affecting the electrical materials and devices, especially without deleteriously affecting of semiconductor integrated circuits.

It was particularly surprising that the cleaning compositions according to the invention were excellently suited for processing substrates useful for fabricating electrical devices, in particular, semiconductor integrated circuits (ICs); liquid crystal panels; organic electroluminescent panels; printed circuit boards; micro machines; DNA chips; micro plants and magnetic heads; more preferably ICs with LSI (large-scale integration) or VLSI (very-large-scale integration); as well as optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic disks.

Further details, modifications and advantages of the present invention are explained in the attached set of claims as well as in the following description and the examples.

A composition according to the present invention is preferred, wherein the pH of the composition is in the range of from 7.5 to 10, preferably in the range of from 7.5 to 9.5, more preferably in the range of from 7.5 to 9.0, more preferably in the range of from 8.0 to 9.5, more preferably in the range of from 8.0 to 9.0.

It has become apparent that the pH of the composition of the present invention is an important feature for the cleaning performance, and it can be observed that particularly good cleaning results of substrates that contain or consist of cobalt or cobalt alloys are achieved in the above specified pH ranges.

A composition according to the present invention is preferred, wherein said polyethylene glycol (PEG) (used as component (A)) has one or more, preferably all of the following properties:
dynamic viscosity of less than 30 mPas, preferably less than 28.5 mPas at 99° C. (measured according to DIN EN 12092, preferably according to DIN EN 12092: 2002-02),
and/or
a pH of 7.0 of a 5 wt. % aqueous solution or dispersion, wherein the PEG is dissolved or dispersed in water.

The above listed properties of the preferred polyethylene glycol (PEG) are features that the polymer shows as a separate component prior to its use in the composition.

A composition according to the present invention is preferred, wherein said anionic polymer (B) is a poly(acrylic acid) (PAA) or an acrylic acid-maleic acid copolymer.

A composition according to the present invention is preferred, wherein said anionic polymer (B) is an acrylic acid-maleic acid copolymer with a mass average molar mass (Mw) of up to 10,000 g/mol, preferably up to 7,000 g/mol, more preferably up to 4,000 g/mol.

It was surprisingly found that the cleaning compositions with the above specified anionic polymer (B) are especially suitable for efficiently removing post-CMP residues and contaminants from a substrate that contains or consists of cobalt or cobalt alloys without deleteriously affecting the electrical materials and devices.

A composition according to the present invention is preferred, wherein said anionic polymer of component (B) is an acrylic acid-maleic acid copolymer which has one or more, preferably all of the following properties:
dynamic viscosity of less than 45 mPas, preferably less than 35 mPas at 23° C. (measured according to DIN EN ISO 2555, preferably according to DIN EN ISO 2555: 2000-01),
and/or
a pH between 1.3 and 1.7, preferably 1.5 of a 5 wt. % aqueous solution or dispersion, wherein the acrylic acid-maleic acid copolymer is dissolved or dispersed in water,
and/or
mass average molar mass (Mw) in the range from 2,500 g/mol to 3,500 g/mol, preferably in the range from 2,800 g/mol to 3,200 g/mol,
and/or
density in the range of from 1.15 g/cm$^3$ and 1.3 g/cm$^3$, preferably 1.23 g/cm$^3$.

The above listed properties of the preferred acrylic acid-maleic acid copolymer are features that the polymer shows as a separate component prior to its use in the composition; this applies in particular to the pH, the dynamic viscosity, and the density.

Particularly preferred is a composition according to the present invention, further (i.e. additionally) comprising (D) one, two or more corrosion inhibitors.

Particularly preferred is a composition according to the present invention, wherein the total amount of said corrosion inhibitors (D) is in the range of from 0.001 wt.-% to 3 wt.-%, preferably in the range of from 0.001 wt.-% to 1.5 wt.-%, more preferably 0.001 wt.-% to 0.5 wt.-%, most preferred 0.001 wt.-% to 0.1 wt.-%, based on the total weight of the composition.

Corrosion inhibitors protect the substrate from oxidation and corrosion. The corrosion inhibitors are preferably film-forming corrosion inhibitors effective in forming a film on the metal of the semiconductor work-piece that protects the metal from chemical, galvanic and/or photo-induced oxidation during and after the cleaning step.

Preferred corrosion inhibitors (D) are selected from the group consisting of acetylcysteine, N-acyl-sarcosines, preferably N-oleoylsarcosine or N-dodecanoyl-N-methylglycine, alkylsulfonic acids (e.g. with a chain length of less than 10 carbon atoms), alkyl-aryl sulfonic acids, preferably dodecylbenzenesulfonic acid, isophthalic acid, alkyl phosphates, polyaspartic acid, imidazole and its derivatives, preferably imidazole, polyethylenimine with a mass average molar mass (Mw) in the range of from 200 to 2,000 g/mol, derivatives of triazoles, preferably benzotriazole derivatives, more preferably benzotriazol and 2,2'-(((5-Methyl-1H-benzotriazol-1-yl)methyl)imino)bisethanol, and derivatives of ethylene diamine, preferably N,N,N',N'-tetrakis(2-hydroxypropyl)ethylenediamine.

Particularly preferred is a composition according to the present invention, further (i.e. additionally) comprising (E) one, two or more defoamers.

Particularly preferred is a composition according to the present invention, wherein the total amount of said defoamers (E) is in the range of from 0.01 wt.-% to 0.5 wt.-%, based on the total weight of the composition.

A composition according to the present invention is preferred, wherein the defoamers (E) are selected from the group consisting of N-octyl pyrrolidone, monoglycerides of fatty acids, diglycerides of fatty acids, tri-n-butyl phosphate, tri-iso-butyl phosphate, methanol and primary, secondary or tertiary alcohols (preferably aliphatic alcohols) having 2 to 12 carbon atoms, preferably hexanol. Alcohols, preferably aliphatic alcohols having 2 to 12 carbon atoms, preferably hexanol, are especially preferred in a composition according to the present invention.

Particularly preferred is a composition according to the present invention, further (i.e. additionally) comprising (F) a base, wherein said base (F) is preferably
a) potassium hydroxide
or
b) free of tetramethylammonium hydroxide (TMAH) and tetraethyl ammonium hydroxide (TEAH), preferably free of quaternary ammonium cations.

It is particularly preferred, if the composition according to the invention does not comprise any compound with the formula $NR_1R_2R_3R_4OH$, wherein $R_1$, $R_2$, $R_3$ and $R_4$ may be the same as or different from one another and are selected from the group consisting of hydrogen, straight-chained or branched C1-C6 alkyl (e.g., methyl, ethyl, propyl, butyl, pentyl, and hexyl), and substituted or unsubstituted C5-C10 aryl, e.g., benzyl. It is especially preferred if the composition according to the invention does not comprise any compound selected from the group consisting of tetramethylammonium hydroxide, tetrapropylammonium hydroxide, tetrabutylammonium hydroxide, tetraethylammonium hydroxide, benzyltriethylammonium hydroxide, benzyltrimethylammonium hydroxide, tributylmethylammonium hydroxide, choline hydroxide, ammonium hydroxide, (2-hydroxyethyl) trimethylammonium hydroxide, (2-hydroxyethyl) triethylammonium hydroxide, (2-hydroxyethyl) tripropylammonium hydroxide, (1-hydroxypropyl) trimethylammonium hydroxide, ethyltrimethylammonium hydroxide, and diethyldimethylammonium hydroxide.

It was surprisingly found that cleaning compositions according to the invention which do not comprise quaternary ammonium cations or compounds with the formula $NR_1R_2R_3R_4OH$ as specified above are particularly environmentally friendly.

A composition according to the present invention is preferred, wherein all constituents of the cleaning composition are in the liquid phase, wherein preferably all constituents of the cleaning composition are in the same liquid phase.

It was surprisingly found that cleaning compositions, wherein all constituents of the cleaning composition are already in the same liquid phase are particularly easy to use, especially because it is not necessary do dissolve solid particles prior use. Compositions, wherein all constituents of the cleaning composition are already in the same liquid phase can be directly used out of the storage tank.

A composition according to the present invention is preferred, wherein the composition has a sodium cation concentration of less than 500 ppm, preferably less than 100 ppm.

As used herein, "contaminants" correspond to chemicals or materials present in the CMP slurry, reaction by-products of the polishing slurry, and any other materials that are the by-products of the CMP process, such as metal oxides, metal ions and complexes thereof, organic residues, inorganic particles, silica-containing particles, carbon-rich particles, polishing pad particles, and any other materials that are the by-products of the CMP process.

As used herein, "residue" corresponds to materials, particles, chemicals, and reaction by-products generated or added during the manufacture of a microelectronic device before the CMP process, including, but not limited to, plasma etching, ashing, wet etching, and combinations thereof.

The term "substrate" designates any construction comprising semiconductive material and/or metal layers on semiconductive materials, especially cobalt or cobalt alloy layers on semiconductive materials, including, but not limited to, bulk semiconductive materials such as a semiconductive wafer (either alone or in assemblies comprising cobalt or a cobalt alloy and/or other materials thereon), and semiconductive material layers (either alone or in assemblies comprising cobalt or a cobalt alloy and/or other materials thereon).

A composition according to the present invention is preferably suitable for the cleaning of semiconductor devices, especially for the cleaning of semiconductor devices comprising cobalt or a cobalt alloy.

As used herein, "semiconductor devices" corresponds to electrical devices or materials, in particular, semiconductor integrated circuits (ICs); liquid crystal panels; organic electroluminescent panels; printed circuit boards; micro machines; DNA chips; micro plants and magnetic heads; more preferably ICs with LSI (large-scale integration) or VLSI (very-large-scale integration); as well as optical devices, in particular, optical glasses such as photo-masks, lenses and prisms; inorganic electro-conductive films such as indium tin oxide (ITO); optical integrated circuits; optical switching elements; optical waveguides; optical monocrystals such as the end faces of optical fibers and scintillators; solid laser monocrystals; sapphire substrates for blue laser LEDs; semiconductor monocrystals; and glass substrates for magnetic discs.

A post chemical-mechanical-polishing (post-CMP) cleaning composition according to the invention is preferred, wherein the composition consists of:
(A) polyethylene glycol (PEG) with a mass average molar mass (Mw) in the range of from 400 to 8,000 g/mol, preferably in the range of from 600 to 4,000 g/mol, more preferably in the range of from 600 to 2,000 g/mol, more preferably in the range of from 600 to 1500 g/mol,
(B) an anionic polymer selected from the group consisting of poly(acrylic acid) (PAA), acrylic acid-maleic acid copolymers, polyaspartic acid (PASA), polyglutamic acid (PGA), polyvinylphosphonic acid, polyvinylsulfonic acid, poly(styrenesulfonic acid), polycarboxylate ethers (PCE), PEG-phosphorous acids, and copolymers of said polymers, preferably wherein said anionic polymer (B) is an acrylic acid-maleic acid copolymer,
(C) water,
(D) optionally one, two or more corrosion inhibitors, preferably selected from the group consisting of acetylcysteine, N-acyl-sarcosines, preferably N-oleoylsarcosine or N-dodecanoyl-N-methylglycine, alkylsulfonic acids, alkyl-aryl sulfonic acids, preferably dodecylbenzenesulfonic acid, isophthalic acid, alkyl phosphates, polyaspartic acid, imidazole and its derivatives (preferably imidazole), polyethylenimine with a mass average molar mass (Mw) in the range of from 200 to 2,000 g/mol, derivatives of triazoles, preferably benzotriazole derivatives, more preferably benzotriazol and 2,2'-(((5-Methyl-1H-benzotriazol-1-yl)methyl)imino)bisethanol, and derivatives of ethylene diamine, preferably N,N,N'N'-tetrakis(2-hydroxypropyl)ethylenediamine,
(E) optionally one, two or more defoamers, preferably selected from the group consisting of N-octyl pyrrolidone, monoglycerides of fatty acids, diglycerides of fatty acids, tri-n-butyl phosphate, tri-iso-butyl phosphate, and primary, secondary or tertiary alcohols having 2 to 12 carbon atoms, preferably hexanol, and
(F) optionally a base, preferably potassium hydroxide, wherein the pH of the composition is in the range of from 7.0 to 10.5.

A post chemical-mechanical-polishing (post-CMP) cleaning composition according to the invention is preferred, wherein the composition comprises:
(A) polyethylene glycol (PEG) with a mass average molar mass (Mw) in the range of from 400 to 8,000 g/mol, preferably in the range of from 600 to 4,000 g/mol, more preferably in the range of from 600 to 2,000 g/mol, more preferably in the range of from 600 to 1500 g/mol,
(B) poly(acrylic acid) (PAA) or acrylic acid-maleic acid copolymer with a mass average molar mass (Mw) of up to 10,000 g/mol,
(C) water,
(D) optionally one, two or more corrosion inhibitors, preferably selected from the group consisting of acetylcysteine, N-acyl-sarcosines, preferably N-oleoylsarcosine or Ndodecanoyl-N-methylglycine, alkylsulfonic acids, alkyl-aryl sulfonic acids, preferably dodecylbenzenesulfonic acid, isophthalic acid, alkyl phosphates, polyaspartic acid, imidazole and its derivatives (preferably imidazole), polyethylenimine with a mass average molar mass (Mw) in the range of from 200 to 2,000 g/mol, derivatives of triazoles, preferably benzotriazole derivatives, more preferably benzotriazol and 2,2'-(((5-Methyl-1H-benzotriazol-1-yl)methyl)imino)bisethanol, and derivatives of ethylene diamine, preferably N,N,N',N'-tetrakis(2-hydroxypropyl)ethylenediamine,
(E) optionally one, two or more defoamers, preferably selected from the group consisting of N-octyl pyrrolidone, monoglycerides of fatty acids, diglycerides of fatty acids, tri-n-butyl phosphate, tri-iso-butyl phosphate, and primary, secondary or tertiary alcohols having 2 to 12 carbon atoms, preferably hexanol, and
(F) optionally a base, preferably potassium hydroxide, wherein the pH of the composition is in the range of from 7.0 to 10.5, preferably in the range of from 7.5 to 9.5, more preferably in the range of from 7.5 to 9.0, more preferably in the range of from 8.0 to 9.5, more preferably in the range of from 8.0 to 9.0.

A post chemical-mechanical-polishing (post-CMP) cleaning composition according to the invention is preferred, wherein the composition consists of:
(A) polyethylene glycol (PEG) with a mass average molar mass (Mw) in the range of from 400 to 8,000 g/mol, preferably in the range of from 600 to 4,000 g/mol, more preferably in the range of from 600 to 2,000 g/mol, more preferably in the range of from 600 to 1500 g/mol,
(B) poly(acrylic acid) (PAA) or acrylic acid-maleic acid copolymer with a mass average molar mass (Mw) of up to 10,000 g/mol,
(C) water,
(D) optionally one, two or more corrosion inhibitors, preferably selected from the group consisting of acetylcysteine, N-acyl-sarcosines, preferably N-oleoylsarcosine or Ndodecanoyl-N-methylglycine, alkylsulfonic acids, alkyl-aryl sulfonic acids, preferably dodecylbenzenesulfonic acid, isophthalic acid, alkyl phosphates, polyaspartic acid, imidazole and its derivatives (preferably imidazole), polyethylenimine with a mass average molar mass (Mw) in the range of from 200 to 2,000 g/mol, derivatives of triazoles, preferably benzotriazole derivatives, more preferably benzotriazol and 2,2'-(((5-Methyl-1H-benzotriazol-1-yl)methyl)imino)bisethanol, and derivatives of ethylene diamine, preferably N,N,N',N'-tetrakis(2-hydroxypropyl)ethylenediamine,
(E) optionally one, two or more defoamers, preferably selected from the group consisting of, N-octyl pyrrolidone, monoglycerides of fatty acids, diglycerides of fatty acids, tri-n-butyl phosphate, tri-iso-butyl phosphate, and primary, secondary or tertiary alcohols having 2 to 12 carbon atoms, preferably hexanol, and
(F) optionally a base, preferably potassium hydroxide, wherein the pH of the composition is in the range of from 7.0 to 10.5, preferably in the range of from 7.5 to 9.5, more preferably in the range of from 7.5 to 9.0, more preferably in the range of from 8.0 to 9.5, more preferably in the range of from 8.0 to 9.0.

Particularly preferred are post-CMP cleaning compositions according to the present invention, wherein two or more of the above defined preferred features are combined. Further preferably, one, two, three or each of the constituents (A) to (F) of the post-CMP cleaning compositions according to the present invention are present in the form of one of the preferred embodiments of said constituent and/or in the preferred concentration range of said constituent.

For certain applications, a composition according to the present invention is preferred, wherein the composition is a ready-to-use post chemical-mechanical-polishing (post-CMP) cleaning composition, comprising:
(A) a total amount of the polyethylene glycol (PEG) in a range of from 0.001 to 0.125 wt.-%, preferably 0.001 to 0.09 wt.-%, based on the total weight of the composition, and
(B) a total amount of the one or more anionic polymers in a range of from 0.001 to 0.125 wt.-%, preferably 0.001 to 0.09 wt.-%, based on the total weight of the composition.

For certain applications, a composition according to the present invention is preferred, wherein the composition is a post chemical-mechanical-polishing (post-CMP) cleaning composition concentrate, comprising:
(A) a total amount of the polyethylene glycol (PEG) in a range of from 0.1 to 7.5 wt.-%, preferably 0.1 to 5 wt.-%, more preferably 0.1 to 3 wt.-%, based on the total weight of the composition, and
(B) a total amount of the one or more anionic polymers in a range of from 0.1 to 7.5 wt.-%, preferably 0.1 to 5 wt.-%, more preferably 0.1 to 3 wt.-%, based on the total weight of the composition.

A composition according to the present invention is preferred, wherein the mass ratio of constituent (A) and constituent (B) is in the range of from 1:50 to 50:1, preferably from 1:30 to 30:1, more preferably from 1:5 to 5:1.

A post chemical-mechanical-polishing (post-CMP) cleaning composition concentrate according to the invention is preferred, wherein the composition consists of:
(A) a total amount of polyethylene glycol (PEG) with a mass average molar mass (Mw) in the range of from 400 to 8,000 g/mol, preferably in the range of from 600 to 4,000 g/mol, more preferably in the range of from 600 to 2,000 g/mol, more preferably in the range of from 600 to 1500 g/mol, in a range of from 0.1 to 7.5 wt.-%, preferably 0.1 to 5 wt.-%, more preferably 0.1 to 3 wt.-%, based on the total weight of the composition,
(B) a total amount of anionic polymer selected from the group consisting of poly(acrylic acid) (PAA), acrylic acid-maleic acid copolymers, polyaspartic acid (PASA), poly-glutamic acid (PGA), polyvinylphosphonic acid, polyvinylsulfonic acid, poly(styrenesulfonic acid), polycarboxylate ethers (PCE), PEG-phosphorous acids, and copolymers of said polymers, preferably wherein said anionic polymer (B) is an acrylic acid-maleic acid copolymer, in a range of from 0.1 to 7.5 wt.-%, preferably 0.1 to 5 wt.-%, more preferably 0.1 to 3 wt.-%, based on the total weight of the composition.
(C) a total amount of water in a range of from 99.8 to 75 wt.-%, based on the total weight of the composition,
(D) optionally a total amount of one, two or more corrosion inhibitors, preferably selected from the group consisting of acetylcysteine, N-acyl-sarcosines, preferably N-oleoyl-sarcosine or N-dodecanoyl-N-methylglycine, alkylsulfonic acids, alkyl-aryl sulfonic acids, preferably dodecylbenzenesulfonic acid, isophthalic acid, alkyl phosphates, polyaspartic acid, imidazole and its derivatives (preferably imidazole), polyethylenimine with a mass average molar mass (Mw) in the range of from 200 to 2,000 g/mol, derivatives of triazoles, preferably benzotriazole derivatives, more preferably benzotriazol and 2,2'-(((5-Methyl-1H-benzotriazol-1-yl)methyl)imino)bisethanol, and derivatives of ethylene diamine, preferably N,N,N',N'-tetrakis(2-hydroxypropyl)ethylenediamine, in the range of from 0.001 wt.-% to 3 wt.-%, preferably in the range of from 0.001 wt.-% to 1.5 wt.-%, more preferably 0.001 wt.-% to 0.5 wt.-%, most preferred 0.001 wt.-% to 0.1 wt.-%, based on the total weight of the composition,
(E) optionally a total amount of one, two or more defoamers, preferably selected from the group consisting of, N-octyl pyrrolidone, monoglycerides of fatty acids, diglycerides of fatty acids, tri-n-butyl phosphate, tri-iso-butyl phosphate, and primary, secondary or tertiary alcohols having 2 to 12 carbon atoms, preferably hexanol, in the range of from 0.01 wt.-% to 0.5 wt.-%, based on the total weight of the composition, and
(F) optionally a total amount of a base, preferably potassium hydroxide in a range of from 0 to 6.5 wt.-%, based on the total weight of the composition,
wherein the pH of the composition is in the range of from 7.0 to 10.5, preferably in the range of from 7.5 to 9.5, more preferably in the range of from 7.5 to 9.0, more preferably in the range of from 8.0 to 9.5, more preferably in the range of from 8.0 to 9.0.

A ready-to-use post chemical-mechanical-polishing (post-CMP) cleaning composition according to the invention is preferred, wherein the composition consists of:
(A) a total amount of polyethylene glycol (PEG) with a mass average molar mass (Mw) in the range of from 400 to 8,000 g/mol, preferably in the range of from 600 to 4,000 g/mol, more preferably in the range of from 600 to 2,000 g/mol, more preferably in the range of from 600 to 1500 g/mol, in a range of from 0.001 to 0.15 wt.-%, preferably 0.001 to 0.09 wt.-%, based on the total weight of the composition,
(B) a total amount of anionic polymer selected from the group consisting of poly(acrylic acid) (PAA), acrylic acid-maleic acid copolymers, polyaspartic acid (PASA), poly-glutamic acid (PGA), polyvinylphosphonic acid, polyvinylsulfonic acid, poly(styrenesulfonic acid), polycarboxylate ethers (PCE), PEG-phosphorous acids, and copolymers of said polymers, preferably wherein said anionic polymer (B) is an acrylic acid-maleic acid copolymer, in a range of from 0.001 to 0.15 wt.-%, preferably 0.001 to 0.09 wt.-%, based on the total weight of the composition.
(C) a total amount of water in a range of from 99.998 to 99.5 wt.-%, based on the total weight of the composition,
(D) optionally a total amount of one, two or more corrosion inhibitors, preferably selected from the group consisting of acetylcysteine, N-acyl-sarcosines, preferably N-oleoyl-sarcosine or N-dodecanoyl-N-methylglycine, alkylsulfonic acids, alkyl-aryl sulfonic acids, preferably dodecylbenzenesulfonic acid, isophthalic acid, alkyl phosphates, polyaspartic acid, imidazole and its derivatives (preferably imidazole), polyethylenimine with a mass average molar mass (Mw) in the range of from 200 to 2,000 g/mol, derivatives of triazoles, preferably benzotriazole derivatives, more preferably benzotriazol and 2,2'-(((5-Methyl-1H-benzotriazol-1-yl)methyl)imino)bisethanol, and derivatives of ethylene diamine, preferably N,N,N',N'-tetrakis(2-hydroxypropyl)ethylenediamine, in the range of from 0.00001 wt.-% to 0.075 wt.-%, preferably in the range of from 0.00001 wt.-% to 0.0375 wt.-%, more preferably 0.00001 wt.-% to 0.0125 wt.-%, most preferred 0.00001 wt.-% to 0.0025 wt.-%, based on the total weight of the composition,
(E) optionally a total amount of one, two or more defoamers, preferably selected from the group consisting of, N-octyl pyrrolidone, monoglycerides of fatty acids, diglycerides of fatty acids, tri-n-butyl phosphate, tri-iso-butyl phosphate, and primary, secondary or tertiary alcohols having 2 to 12 carbon atoms, preferably hexanol, in the range of from 0.0001 wt.-% to 0.0125 wt.-%, based on the total weight of the composition, and (F) optionally a total amount of a base, preferably potassium hydroxide in a range of from 0 to 0.1625 wt.-%, based on the total weight of the composition, wherein the pH of the composition is in the range of from 7.0 to 10.5, preferably in the range of from 7.5 to 9.5, more preferably in the range of from 7.5 to 9.0, more preferably in the range of from 8.0 to 9.5, more preferably in the range of from 8.0 to 9.0.

A composition according to the present invention is preferably suitable for removing residues and contaminants from a substrate, preferably a metal-comprising substrate, more preferably a substrate that contains or consists of cobalt or a cobalt alloy.

It is preferred that the post-CMP cleaning composition is produced, distributed, and stored in a concentrated form and is diluted prior to use to obtain a ready to use post-CMP cleaning composition, preferably by diluting with water. Thereby it is preferred that one part by weight of a post-CMP cleaning composition concentrate is diluted with 50 or more parts by weight of the diluent, preferably with 75 or more parts by weight, more preferably with 100 parts or more by weight. Most preferably the diluent is water having an electrical resistivity of above 18MΩ at 25° C. and/or a total organic carbon (TOC) amount of less than 10 ppb.

Substances which because of their structure at the same time fall under the definition of various constituents of a post-CMP cleaning composition according to the invention for quantitative considerations must be assigned in each case to all these constituents. For example, if a composition according to the invention contains in or as constituent (F) one or more bases which at the same time fall under the definition of any other constituent defined herein, for the purpose of quantitative considerations these bases must be assigned to constituent (F) as well as said other constituent(s).

A further aspect of the present invention is the use of a composition according to the invention (as defined above, preferably designated above as being preferred)
as cobalt post chemical-mechanical-polishing cleaner
and/or
for cleaning a substrate comprising cobalt, preferably after chemical-mechanical-polishing
and/or
for removing residues and contaminants from the surface of a semiconductor substrate comprising cobalt or a cobalt alloy.

A further aspect of the present invention, is the use of a cleaning composition comprising or consisting of:
(A) polyethylene glycol (PEG) with a mass average molar mass (Mw) in the range of from 400 to 8,000 g/mol,
(B) an anionic polymer selected from the group consisting of poly(acrylic acid) (PAA), acrylic acid-maleic acid copolymers, polyaspartic acid (PASA), poly-glutamic acid (PGA), polyvinylphosphonic acid, polyvinylsulfonic acid, poly(styrenesulfonic acid), polycarboxylate ethers (PCE), PEG-phosphorous acids, and copolymers of said polymers, and
(C) water,
wherein the pH of the composition is in the range of from 7.0 to 10.5, as a post chemical-mechanical-polishing (post-CMP) cleaning composition.

In a further aspect, the present invention relates to a post chemical-mechanical-polishing (post-CMP) cleaning composition comprising or consisting of:

(A) polyethylene glycol (PEG) with a mass average molar mass (Mw) in the range of from 400 to 8,000 g/mol,
(B) an anionic polymer selected from the group consisting of poly(acrylic acid) (PAA), acrylic acid-maleic acid copolymers, polyglutamic acid (PGA), polyvinylphosphonic acid, polyvinylsulfonic acid, polycarboxylate ethers (PCE), PEG-phosphorous acids, and copolymers of said polymers, and
(C) water,
wherein the pH of the composition is in the range of from 7.0 to 10.5.

In a further aspect, the present invention relates to a process for the manufacture of a semiconductor device from a semiconductor substrate comprising the step of removing residues and contaminants from the surface of the semiconductor substrate by contacting it at least once with a cleaning composition according to the invention.

A process according to the present invention is preferred, wherein the surface is a cobalt or a cobalt alloy comprising surface.

A preferred process according to the present invention further comprises the step of a chemical-mechanical-polishing (CMP), wherein the step of removing residues and contaminants is performed preferably after the chemical-mechanical-polishing (CMP).

In a preferred process according to the present invention, the semiconductor substrate is rinsed one, two, three or more times with the cleaning composition according to the invention, preferably after a chemical-mechanical-polishing (CMP) step. The rinse conditions are generally 10 seconds to 5 minutes rinsing at a temperature in the range of from 20 to 40° C., preferably 30 seconds to 2 minutes rinsing at a temperature in the range of from 20 to 40° C.

In another preferred process according to the present invention, the semiconductor substrate is submerged in or dipped into the cleaning composition according to the invention, and the substrate is preferably cleaned by a megasonic or ultrasonic or Marangoni process while in contact with the cleaning composition.

After the CMP step, the surface of the semiconductor wafer is contacted with a composition of the invention for a time and a temperature sufficient to remove the undesired contaminants and residues from the substrate surface. Optionally, the substrate is then rinsed to remove the composition of the invention and the contaminants and residues and dried to remove any excess liquids like solvents or rinsing agents.

Preferably, in the process according to the invention a bath or a spray application is used to expose the substrate to the cleaning composition according to the invention preferably after a chemical-mechanical-polishing (CMP) step. Bath or spray cleaning times are generally one minute to 30 minutes, preferably 5 minutes to 20 minutes. Bath or spray cleaning temperatures are generally performed at a temperature in the range of from 10° C. to 90° C., preferably in the range of from 20° C. to 50° C. However, megasonic and ultrasonic cleaning, preferably megasonic cleaning methods, can also be applied.

If required, the drying of the substrates can be accomplished by using any combination of air-evaporation, heat, spinning or pressurized gas. The preferred drying technique is spinning under a filtered inert gas flow, such as nitrogen, until the substrate is dry.

The molecular mass, especially the mass average molar mass (Mw), of the polymers used in the composition according to the present invention is determined by gel permeation chromatography.

EXAMPLES AND COMPARATIVE EXAMPLES

The invention is hereinafter further illustrated by means of examples and comparison examples.

Examples 1 to 8

Example 1

For the preparation of 20,000 g of a post-CMP cleaning composition concentrate, 14,000 g of pure water with an electrical resistivity of above 18 MO at 25° C. and a total organic carbon (TOC) amount of less than 10 ppb were provided. The water was stirred and 500 g polyethylene glycol (PEG) with a mass average molar mass (Mw) of 1,500 g/mol (Pluriol 1500) were added and the solution was stirred for at least 20 minutes until the polyethylene glycol (PEG) was dissolved. Subsequently, 2,000 g of an aqueous solution (25 wt. %) of an acrylic acid-maleic acid copolymer (Planapur 12 SEG) were added to the solution and the solution was stirred for further 20 minutes. The pH value of the solution was adjusted to a desired value of 7.5 by adding of an aqueous potassium hydroxide solution (48 wt.-%). The resulting solution was filled up with pure water to an overall weight of 20,000 g.

Examples 2 to 8

The post-CMP cleaning composition concentrates of the examples 2 to 8 were prepared analogously to example 1 by mixing their ingredients. The Table 1 summarizes their compositions.

TABLE 1

| | The compositions of the post-CMP cleaning composition concentrate (Balance: Water) | | | | | | |
|---|---|---|---|---|---|---|---|
| Example No. | constituent (A) | constituent (B) | constituent (D) | constituent (F) | pH | etching rate [Å/min] Co | AFM measurement |
| 1 | PEG $M_w$1500; 2.5 wt.-% | Sokalan CP 12 S; 2.5 wt.-% | — | KOH | 7.5 | 9.5 | good |
| 2 | PEG $M_w$1500; 2.5 wt.-% | Sokalan CP 12 S; 2.5 wt.-% | Sarkosyl O; 0.1 wt.-% | KOH | 9.0 | 7.3 | good |
| 3 | PEG $M_w$1500; 2.5 wt.-% | Sokalan CP 12 S;; 2.5 wt.-% polyaspartic acid; 0.75 wt.-% | Sarkosyl O; 0.75 wt.-% | KOH | 7.5 | 1.6 | good |
| 4 | PEG $M_w$1500; 2.5 wt.-% | Sokalan CP 12 S;; 2.5 wt.-% | Sarkosyl O; 0.75 wt.-% Imidazol; 2.5 wt.-% | KOH | 7.5 | 3.7 | good |
| 5 | PEG $M_w$1500; 2.5 wt.-% | Sokalan CP 12 S;; 2.5 wt.-% | Imidazol; 2.5 wt.-%; Sarkosyl O: 0.75 wt.-%; Quadrol L: 0.75 wt.-% | KOH | 7.5 | 0.0 | good |
| 6 | PEG $M_w$1500; 2.5 wt.-% | polyaspartic acid; 2.5 wt.-% | — | KOH | 7.5 | 3.1 | good |

Comparative Examples 1 to 4

The compositions of comparative examples 1 to 4 were prepared in analogy to example 1 by mixing their ingredients. The Table 2 summarizes their compositions.

TABLE 2

| | The compositions of comparative examples 1 to 4 (Balance: Water) | | | | | | |
|---|---|---|---|---|---|---|---|
| Comparative Example No. | constituent 1 | constituent 2 | constituent 3 | constituent 4 | pH | etching rate [Å/min] Co | AFM measurement |
| 1 | — | — | — | KOH | 8.5 | 6.7 | bad |
| 2 | PEG $M_w$1500; 2.5 wt.-% | — | — | KOH | 8.5 | 2.9 | bad |
| 3 | — | Sokalan CP 12S;; 2.5 wt.-% | — | KOH | 8.5 | 7.5 | bad |
| 4 | — | Sokalan CP 12S;; 2.5 wt.-% | $CaCl_2$ 5 wt.-% | KOH | 8.5 | 15 | bad |

Atomic Force Microscopy (AFM) Measurements:

For determining cleaning efficiency with Atomic force microscopy (AFM), a 2.5×2.5 cm Co (deposited on silicon by a chemical vapor deposition process) wafer coupon which was polished with a BTA and colloidal silica containing barrier CMP Slurry was rinsed with ultra-pure water for 10 s, subsequently dipped for 30 s in a beaker with above mentioned cleaning solutions and stirred with a magnetic stirrer for 30 s (300 rpm). After a final rinsing step for 10 s with ultra-pure water, the coupon was dried with nitrogen flow and submitted to an AFM tool (Bruker ICON, Germany) using tapping mode and a 5×5 µm area with appropriate resolution. The results of the AFM measurement were evaluated and the results were classified in the categories good (few particles), medium (some particles), and bad (many particles). The results are shown in table 1 and 2.

The Etching Rates of the Compositions:

The etching rates of the compositions of the examples 1 to 8 and comparative examples 1 to 4 were measured. All coupons were measured before regarding the thickness of the Co layer by using a 4-point probe device as mentioned below. The above mentioned cobalt coupons were pretreated with a 3% citric acid solution for 5 min to remove native oxide. After rinsing with ultra-pure water, the coupon was immersed in above described PCC solutions for 5 minutes using an agitation by a magnetic stirrer (300 rpm). After removing from the etching bath, the coupons were rinsed with deionized water and the thickness was measured with a 4 point probe device supplied by Napson Corporation, Japan (RG2000). The etching rates (in Angstroms per minute) were calculated. The results are shown in table 1 and 2.

The invention claimed is:

1. A method of cleaning a substrate post chemical mechanical polishing, comprising cleaning a substrate after the substrate has been polished with a chemical mechanical polishing composition comprising an abrasive with a cleaning composition to remove residues and contaminants from the surface of the semiconductor substrate remaining after the polishing, wherein the cleaning composition comprises:
   (A) polyethylene glycol (PEG) with a mass average molar mass (Mw) in the range of from 400 to 8,000 g/mol,
   (B) an anionic polymer selected from the group consisting of poly(acrylic acid) (PAA), acrylic acid-maleic acid copolymers, polyaspartic acid (PASA), poly-glutamic acid (PGA), polyvinylphosphonic acid, polyvinylsulfonic acid, poly(styrenesulfonic acid), polycarboxylate ethers (PCE), PEG-phosphorous acids, and copolymers of said polymers, and
   (C) water,
   wherein the pH of the composition is in the range of from 7.0 to 10.5.

2. The method according to claim 1, wherein the pH of the composition is in the range of from 7.5 to 10.

3. The method according to claim 1, wherein
   i) said anionic polymer (B) is poly(acrylic acid) (PAA) or an acrylic acid-maleic acid copolymer, with a mass average molar mass (Mw) of up to 10,000 g/mol, and/or
   ii) said polyethylene glycol (PEG) has a mass average molar mass (Mw) in the range of from 600 to 4,000 g/mol.

4. The method according to claim 1, wherein the cleaning composition further comprises
   (D) a corrosion inhibitor,
   wherein the total amount of said corrosion inhibitor is in the range of from 0.001 wt.-% to 3 wt.-%, based on the total weight of the composition.

5. The method according to claim 4, wherein the corrosion inhibitor (D) is at least one selected from the group consisting of acetylcysteine, N-acyl-sarcosines, alkylsulfonic acids, alkyl-aryl sulfonic acids, isophthalic acid, alkyl phosphates, polyaspartic acid, imidazole and its derivatives, polyethylenimine with a mass average molar mass (Mw) in the range of from 200 to 2,000 g/mol, derivatives of triazoles, and derivatives of ethylene diamine.

6. The method according to claim 1, wherein the cleaning composition further comprises
   (E) a defoamer,
   wherein a total amount of said defoamer is in the range of from 0.01 wt.-% to 0.5 wt. %, based on the total weight of the cleaning composition
   and/or
   wherein the defoamer (E) is at least one selected from the group consisting of N-octyl pyrrolidone, monoglycerides of fatty acids, diglycerides of fatty acids, tri-n-butyl phosphate, tri-iso-butyl phosphate, methanol and primary, secondary or tertiary alcohols having 2 to 12 carbon atoms.

7. The method according to claim 1, wherein the cleaning composition further comprises
   (F) a base.

8. The method according to claim 1, wherein all constituents of the cleaning composition are in the liquid phase.

9. The method according to claim 1, wherein the composition is a ready-to-use post chemical-mechanical-polishing cleaning composition, comprising:
   (A) a total amount of the polyethylene glycol (PEG) in a range of from 0.001 to 0.15 wt.-%, based on the total weight of the composition,
   and
   (B) a total amount of the one or more anionic polymers in a range of from 0.001 to 0.15 wt.-%, based on the total weight of the composition.

10. The method according to claim 1, wherein the composition is a post chemical-mechanical-polishing cleaning composition concentrate, comprising:
    (A) a total amount of the polyethylene glycol (PEG) in a range of from 0.1 to 7.5 wt.-based on the total weight of the composition,
    and
    (B) a total amount of the one or more anionic polymers in a range of from 0.1 to 7.5 wt.-%, based on the total weight of the composition.

11. The method according to claim 1, wherein the composition is employed
    as cobalt post chemical-mechanical-polishing cleaner
    and/or
    for cleaning a substrate comprising cobalt, and/or
    for removing residues and contaminants from the surface of a semiconductor substrate comprising cobalt or a cobalt alloy.

12. The process according to claim 1, wherein the process is for the manufacture of a semiconductor device from a semiconductor substrate comprising removing residues and contaminants from the surface of the semiconductor substrate by contacting the surface at least once with the composition, wherein the surface is a cobalt or a cobalt alloy-comprising surface.

13. The process according to claim 12, further comprising chemical-mechanical-polishing, wherein the removing of residues and contaminants is performed after the chemical-mechanical-polishing.

* * * * *